(12) United States Patent
Hongo

(10) Patent No.: US 7,961,467 B2
(45) Date of Patent: Jun. 14, 2011

(54) ELECTRONIC APPARATUS

(75) Inventor: Takeshi Hongo, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/622,852

(22) Filed: Nov. 20, 2009

(65) Prior Publication Data
US 2010/0246129 A1    Sep. 30, 2010

(30) Foreign Application Priority Data
Mar. 30, 2009  (JP) .................... 2009-082340

(51) Int. Cl.
*H05K 7/20*   (2006.01)

(52) U.S. Cl. ....... 361/700; 361/719; 257/715; 174/15.2; 165/104.26; 165/104.33

(58) Field of Classification Search .................. None
See application file for complete search history.

(56) References Cited

U.S. PATENT DOCUMENTS

| | | | | |
|---|---|---|---|---|
| 6,257,328 | B1 * | 7/2001 | Fujiwara et al. | 165/185 |
| 7,460,370 | B2 * | 12/2008 | Cheng et al. | 361/700 |
| 7,535,712 | B2 * | 5/2009 | Tanaka | 361/700 |
| 2004/0001316 | A1 * | 1/2004 | Kamikawa et al. | 361/700 |
| 2007/0006996 | A1 * | 1/2007 | Mikubo et al. | 165/104.33 |
| 2008/0093056 | A1 * | 4/2008 | Hwang et al. | 165/104.33 |
| 2008/0156460 | A1 * | 7/2008 | Hwang et al. | 165/80.3 |

FOREIGN PATENT DOCUMENTS

| | | |
|---|---|---|
| JP | 05-264185 | 10/1993 |
| JP | 6304066 | 11/1994 |
| JP | 2000106495 | 4/2000 |
| JP | 2005-136197 | 5/2005 |
| JP | 2006324470 | 11/2006 |
| JP | 2007-034699 | 2/2007 |
| JP | 2007142294 | 6/2007 |
| JP | 2007323160 | 12/2007 |
| JP | 2008-196787 | 8/2008 |

OTHER PUBLICATIONS

Japanese Patent Application No. 2009-082340, Notification of Reasons for Refusal, mailed Aug. 24, 2010, (English Translation).

* cited by examiner

*Primary Examiner* — Boris L Chervinsky
(74) *Attorney, Agent, or Firm* — Blakely, Sokoloff, Taylor & Zafman LLP

(57) ABSTRACT

An electronic apparatus including: a body; a circuit board housed in the body; a heating body mounted on the circuit board; a heat pipe having: an end portion, a heat emitting portion located on an opposite side to the end portion, and a heat receiving portion located between the end portion and the heat emitting portion and thermally connected to the heating body; a bonding member disposed between the heating body and the heat receiving portion and that bonds the heating body and the heat receiving portion; and an extension that extends toward the circuit board.

10 Claims, 12 Drawing Sheets

US 7,961,467 B2

ELECTRONIC APPARATUS

CROSS-REFERENCE TO RELATED APPLICATIONS

This application is based upon and claims the benefit of priority from Japanese Patent Application No. 2009-082340, filed on Mar. 30, 2009, the entire contents of which are incorporated herein by reference.

BACKGROUND

1. Field

An aspect of the present invention relates to an electronic apparatus having a heat pipe.

2. Description of the Related Art

An electronic apparatus such as a personal computer has plural heating bodies, for example. JP-A-2007-34699 discloses an electronic apparatus which is equipped with a radiation structure for cooling plural heating bodies. This electronic apparatus is equipped with a radiator which is opposed to a fan, a first heat pipe for transporting heat generated by a first heating body and a second heat pipe for transporting heat generated by a second heating body to the radiator.

However, in the related technique disclosed in JPA-2007-34699, improving the efficiency of the work of removing the heat pipes is not considered. For example, since each heat pipe is an adhesive heat-conductive member and bonded to a heating component or the like, in removing the heat pipe, the heat pipe may be deformed to be reduced in heat conduction performance unless the load on the heat-conductive member and its neighborhood is dispersed efficiently.

BRIEF DESCRIPTION OF THE SEVERAL VIEWS OF THE DRAWINGS

A general architecture that implements the various feature of the present invention will now be described with reference to the drawings. The drawings and the associated descriptions are provided to illustrate embodiments of the present invention and not to limit the scope of the present invention.

DETAILED DESCRIPTION

Various embodiments according to the present invention will be described hereinafter with reference to the accompanying drawings. In general, according to one embodiment of the present invention, there is provided an electronic apparatus including: a body; a circuit board housed in the body; a heating body mounted on the circuit board; a heat pipe having: an end portion, a heat emitting portion located on an opposite side to the end portion, and a heat receiving portion located between the end portion and the heat emitting portion and thermally connected to the heating body; a bonding member disposed between the heating body and the heat receiving portion and that bonds the heating body and the heat receiving portion; and an extension that extends toward the circuit board.

Portable computers according to embodiments of the present invention will be hereinafter described with reference to the drawings.

Figure 1:
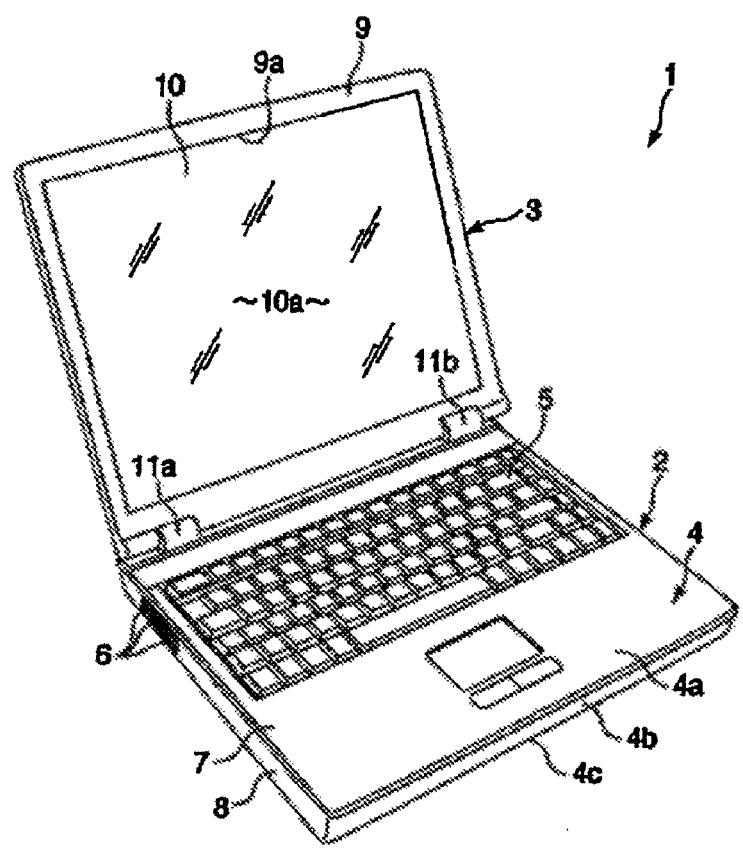
FIG. 1 is an exemplary perspective view of a portable computer according to a first embodiment of the present invention.

FIGS. 1 to 4 show a portable computer 1 as an electronic apparatus according to a first embodiment of the invention. FIG. 1 shows the entire portable computer 1. As shown in FIG. 1, the portable computer 1 is equipped with a main body 2 and a display unit 3. The main body 2 has a box-shaped body 4.

The body 4 has a top wall 4a, a circumferential wall 4b, and a bottom wall 4c. The top wall 4a supports a keyboard 5. The circumferential wall 4b is formed with vents 6. The body 4 has a body cover 7 which includes the top wall 4a and a body base 8 which includes the bottom wall 4c. The body cover 7 is joined to the body base 8 from above, whereby an accommodation space is formed between them.

As shown in FIG. 1, the display unit 3 is equipped with a display housing 9 and a display device 10 which is housed in the display housing 9. The display device 10 has a display screen 10a, which is exposed through a front opening 9a of the display housing 9.

The display unit 3 is supported by a rear end portion of the body 4 via hinges 11a and 11b. As such, the display unit 3 can be rotated between a closed position where it covers the top wall 4a from above and an open position where it is erected so as to expose the top wall 4a.

Figure 2:
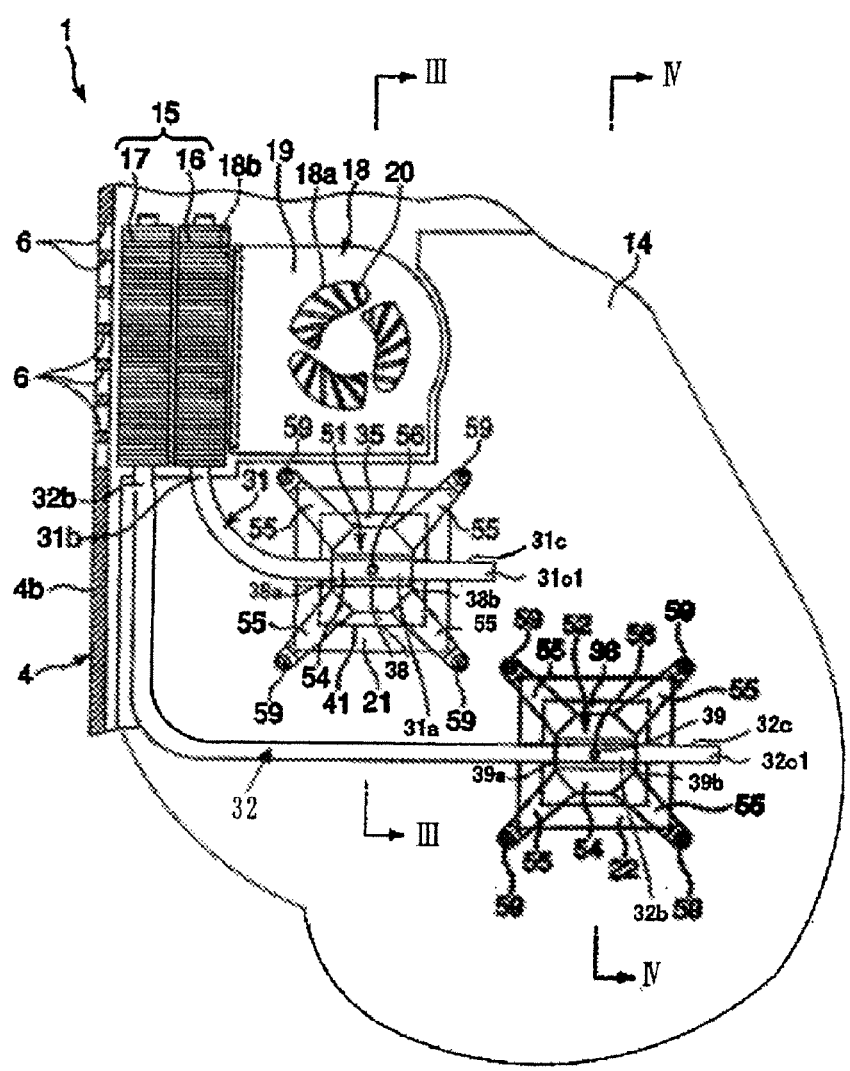
FIG. 2 is an exemplary partially sectional view of the portable computer of FIG. 1.

FIG. 2 shows a part of the inside of the body 4. As shown in FIG. 2, a circuit board 14 is housed in the body 4. And a radiation unit 15 is provided in the body 4 so as to be opposed to the vents 6 of the circumferential wall 4b. The radiation unit 15 includes a first radiation member 16 and a second radiation member 17 which are independent of each other. The term "independent of each other" means that the first radiation member 16 and the second radiation member 17 are not connected to each other and a position, an inclination, or the like of one of the radiation members 16 and 17 does not influence the other. An example of each of the first radiation member 16 and the second radiation member 17 is a radiation fin assembly having plural fins.

As shown in FIG. 2, a cooling fan 18 is housed in the body 4 so as to be opposed to the radiation unit 15. For example, the cooling fan 18 is equipped with a fan case 19 and an impeller 20 which is rotationally driven in the fan case 19. The fan case 19 is formed with inlets 18a which communicate with the internal space of the body 4 and an outlet 18b which is opposed to the radiation unit 15.

The cooling fan 18 suctions air from the inside space of the body 4 through the inlets 18a and discharges the suctioned air toward the radiation unit 15 through the outlet 18b. The first radiation member 16 and the second radiation member 17 are arranged in cascade in the air discharge direction of the cooling fan 18. The single cooling fan 18 cools the two radiation members 16 and 17 together.

As shown in FIG. 2, a first heating body 21 and a second heating body 22 are mounted on the circuit board 14. The first heating body 21 and the second heating body 22 are electronic components that generate heat during use, and examples of the heating bodies 21 and 22 are a CPU, a graphic chip, a north bridge (registered trademark), and a memory. However, each of the heating bodies 21 and 22 is not limited to these examples and may be any of various components that require heat radiation.

As shown in FIG. 2, a first heat pipe 31 and a second heat pipe 32 are provided in the body 4. The first heat pipe 31 and the second heat pipe 32 are together disposed on one side of the cooling fan 18. As a result, the heat pipes 31 and 32 hardly restrict the mounting position of the cooling fan 18 and the circuit board 14 is able to be more freely designed.

For example, each of the first heat pipe 31 and the second heat pipe 32 is provided with a container having a hollow internal space, a wick provided inside the container, and operating fluid sealed in the container. Each of the first heat pipe 31 and the second heat pipe 32 transports heat utilizing evaporation/condensation latent heat of the operating fluid.

More specifically, each of the heat pipes 31 and 32 has a heat receiving portion for receiving heat from the associated heating body and a heat emitting portion which is thermally connected to the radiation unit 15. The operating fluid evaporates at the heat receiving portion and absorbs heat there and moves to the heat emitting portion in the form of gas. The operating fluid condenses at the heat emitting portion by emitting heat there and returns to the heat receiving portion in the form of liquid. In this manner, each of the heat pipes 31 and 32 transports heat from the associated heating body to the radiation unit 15.

As shown in FIG. 2, the first heat pipe 31 extends from the first heating body 21 to the radiation unit 15. The first heat pipe 31 is provided with a heat receiving portion 31a, a first end portion 31b, and a second end portion 31c. The heat receiving portion 31a is located between the first end portion 31b and the second end portion 31c. The heat receiving portion 31a is thermally connected to the first heating body 21. The first end portion 31b is a heat emitting portion which is thermally connected to the first radiation member 16. The first heat pipe 31 receives heat from the first heating body 21 and transports the received heat to the first radiation member 16. In the portable computer 1 according to the embodiment, the second end portion 31c has an extension 31c1 which extends toward the circuit board 14. The extension 31c1 will be described later with reference to FIG. 5.

Figure 3:
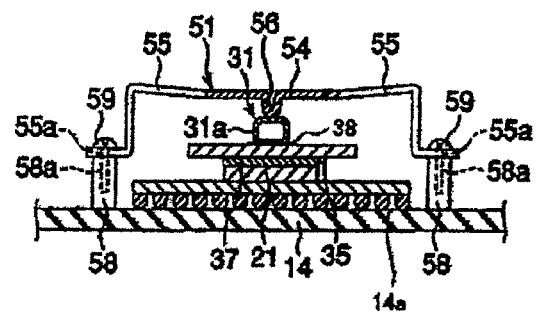
FIG. 3 is an exemplary sectional view, taken along line III-III in FIG. 2, of a first heating body and nearby members.

As shown in FIG. 3, a first heat receiving member 35 is disposed between the first heat pipe 31 and the first heating body 21. An example of the first heat receiving member 35 is a heat receiving plate. The first heat receiving member 35 is opposed to and thermally connected to the first heating body 21. The confronting surfaces of the first heat receiving member 35 and the first heating body 21 are coated with a heat-conductive grease 37, for example, which strengthens the heat connection between them.

As shown in FIG. 3, the confronting surfaces of the heat receiving portion 31a of the first heat pipe 31 and the first heat receiving member 35 are coated with a heat-conductive bonding member 38, for example, which strengthens the heat connection between them. The heat-conductive bonding member 38, which is an adhesive bonding member, fixes the first heat pipe 31 to the first heat receiving member 35 strongly.

Figure 4:
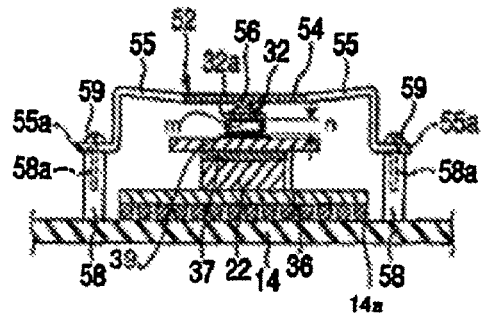
FIG. 4 is an exemplary sectional view, taken along line IV-IV in FIG. 2, of a second heating body and nearby members.

On the other hand, as shown in FIG. 2, the second heat pipe 32 extends from the second heating body 22 to the radiation unit 15. As shown in FIG. 4, the second heat pipe 32 is flatter than the first heat pipe 31; that is, the former is designed so that the width m in the direction parallel with the circuit board 14 (i.e., its component mounting surface 14a on which the electronic components such as the second heating body 22 are mounted) is greater than the width n in the direction perpendicular to the circuit board 14.

Being a flat member, the second heat pipe 32 can be used with heating components having large mounting heights. For example, the second heat pipe 32 can increase the degree of freedom of designing than the first heat pipe 31 because the second heat pipe 32 dispenses with the need for increasing the sizes of other components and the body so that they conform in height to heating components having large mounting heights.

The second heat pipe 32 is provided with a heat receiving portion 32a, a first end portion 32b, and a second end portion 32c. The heat receiving portion 32a is located between the first end portion 32b and the second end portion 32c. In the portable computer 1 according to the embodiment, the second end portion 32c has an extension 32c1 which extends toward the circuit board 14. The extension 32c1 will be described later with reference to FIG. 7.

The heat receiving portion 32a is thermally connected to the second heating body 22. The first end portion 32b is a heat emitting portion which is thermally connected to the second radiation member 17. The second heat pipe 32 receives heat from the second heating body 22 and transports the received heat to the second radiation member 17.

As shown in FIG. 4, a second heat receiving member 36 is disposed between the second heat pipe 32 and the second heating body 22. An example of the second heat receiving member 36 is a heat receiving plate. The second heat receiving member 36 is opposed to and thermally connected to the second heating body 22. The confronting surfaces of the second heat receiving member 36 and the second heating body 22 are coated with a heat-conductive grease 37, for example, which strengthens the heat connection between them.

As shown in FIG. 4, the confronting surfaces of the heat receiving portion 32a of the second heat pipe 32 and the second heat receiving member 36 are coated with a heat-conductive bonding member 39, for example, which strengthens the heat connection between them. The heat-conductive bonding member 39, which is an adhesive bonding member, fixes the second heat pipe 32 to the second heat receiving member 36 strongly.

The heat-conductive bonding members 38 and 39 are flexible. In the embodiment, the term "flexible" means that, for example, the heat-conductive bonding members 38 and 39 can be deformed according to the sizes of the gap between the first heat pipe 31 and the first heat receiving member 35 and the gap between the second heat pipe 32 and the second heat receiving member 36, respectively. From another point of view, "flexible" means that, for example, each of the heat-conductive bonding members 38 and 39 can absorb a variation, caused by the allowances of the individual components, in the gap between the first heat pipe 31 and the first heat receiving member 35 or the gap between the second heat pipe 32 and the second heat receiving member 36.

An example of each of the heat-conductive bonding members 38 and 39 is an adhesive heat-conductive sheet. For example, the adhesive heat-conductive sheet is mainly made of a synthetic resin and is so high in flexibility as to be able to be deformed according to the component shapes.

Being flexible, each of the heat-conductive bonding members 38 and 39 can absorb a variation, caused by the allowances of the individual components, in the gap between the first heat pipe 31 and the first heat receiving member 35 or the gap between the second heat pipe 32 and the second heat receiving member 36. The heat-conductive bonding members 38 and 39 thus enable stronger thermal connections between the first heat pipe 31 and the first heating body 21 and between the second heat pipe 32 and the second heating body 22.

The heat-conductive bonding member 38 has bonding regions 38a and 38b, and the heat-conductive bonding member 39 has bonding regions 39a and 39b. The bonding regions 38a and 39a are coating regions of the heat-conductive bonding members 38 and 39 located on the side of the first end portions 31b and 32b, respectively. The bonding regions 38a and 39a are coating regions of the heat-conductive bonding members 38 and 39 located on the side of the second end portions 31c and 32c, respectively.

As shown in FIG. 2, the circuit board 14 is mounted with a first pressing member 51 and a second pressing member 52 for fixing the first heat pipe 31 and the second heat pipe 32, respectively. As shown in FIGS. 2 and 3, the first pressing member 51 has a main portion 54 and plural (e.g., four) legs 55.

The main portion 54 has a plate-like shape, for example, and is opposed to the heat receiving portion 31a of the first heat pipe 31. The main portion 54 is provided with a projection 56 which projects toward the first heat pipe 31. The legs 55 extend outward from peripheral portions of the main portion 54 and then bent toward the circuit board 14. Tip portions of the legs 55 are formed with screw insertion holes 55a, respectively. The main portion 54 and the legs 55 together form a leaf spring structure.

As shown in FIG. 3, plural studs 58 are erected from the circuit board 14 at such positions as to correspond to the respective legs 55 of the first pressing member 51. Each stud 58 has a fixing hole 58a which is formed with a female screw. Screws 59 are inserted in the screw insertion holes 55a of the legs 55 and threadedly engaged with the fixing holes 58a of the studs 58, respectively, whereby the first pressing member is fixed to the circuit board 14. The first pressing member 51 functions as a leaf spring, and its projection 56 presses the heat receiving portion 31a of the first heat pipe against the first heating body 21. The first pressing member 51 is not in contact with the second heat pipe 32, that is, a gap is formed between them.

Like the first pressing member 51, the second pressing member 52 has a main portion 54 and plural (e.g., four) legs 55. The main portion 54 has a plate-like shape, for example, and is opposed to the heat receiving portion 32a of the second heat pipe 32. The main portion 54 is provided with a projection 56 which projects toward the second heat pipe 32. The main portion 54 and the legs 55 together form a leaf spring structure.

As shown in FIG. 4, plural studs 58 are erected from the circuit board 14 at such positions as to correspond to the respective legs 55 of the second pressing member 52. Screws 59 are inserted in the screw insertion holes 55a of the legs and threadedly engaged with the fixing holes 58a of the studs 58, respectively, whereby the second pressing member 52 is fixed to the circuit board 14. The second pressing member 52 functions as a leaf spring, and its projection 56 presses the heat receiving portion 32a of the second heat pipe 32 against the second heating body 22.

Next, the workings of the portable computer 1 will be described.

While the portable computer 1 is used, the first heating body 21 and the second heating body 22 heat up. Most of the heat generated by the second heating body 22 is received by the heat receiving portion 32a of the second heat pipe 32 via the second heat receiving member 36 and then transported to the radiation unit 15 by the second heat pipe 32.

On the other hand, part of the heat generated by the first heating body 21 is received by the heat receiving portion 31a of the first heat pipe 31 via the first heat receiving member 35 and then transported to the radiation unit 15 by the first heat pipe 31.

Since the heat receiving portion 31a of the first heat pipe 31 is pressed by the pressing member 51 against the heat-conductive bonding member 38, the heat receiving portion 31a is not prone to go up away from the first heating body 21 and hence can be thermally connected to the first heating body 21 more strongly. Furthermore, the flexible heat-conductive bonding member 38 allows the heat receiving portion 31a of the first heat pipe 31 to be thermally connected to the heat-conductive bonding member 38 strongly being pressed by the pressing member 51.

Since the heat receiving portion 32a of the second heat pipe 32 is pressed by the pressing member 52 against the heat-conductive bonding member 39, the heat receiving portion 32a is not prone to go up away from the second heating body 22 and hence can be thermally connected to the second heating body 22 more strongly. Furthermore, the flexible heat-conductive bonding member 39 allows the heat receiving portion 32a of the second heat pipe 32 to be thermally connected to the heat-conductive bonding member 39 strongly being pressed by the pressing member 52.

The first heat receiving member 35 and the second heat receiving member 36 make it possible to secure large thermal connection areas between the heating bodies 21 and 22 and the heat pipes 31 and 32, respectively. Since the first heat radiation member 16 and the second heat radiation member 17 are independent of each other, the first heat pipe 31 and the second heat pipe 32 can be implemented according to the component allowances of the first heating body 21 and the second heating body 22, respectively. Since the heating bodies 21 and 22 are connected to the respective heat receiving members 35 and 36 by the heat-conductive grease 37, the former can be thermally connected to the latter more strongly than in the case of using heat-conductive sheets, for example.

Figure 5:
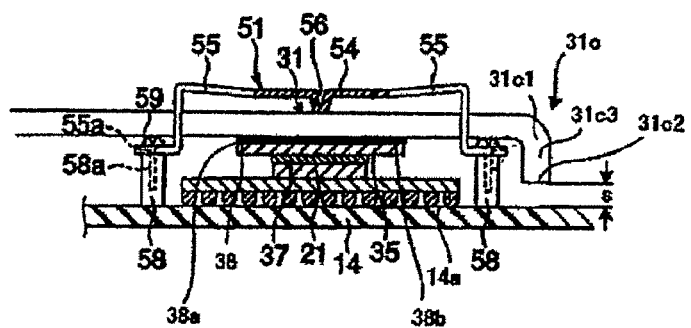
FIG. 5 shows an exemplary extension of a first heat pipe and nearby members according to the first embodiment of the invention.
Figure 6:
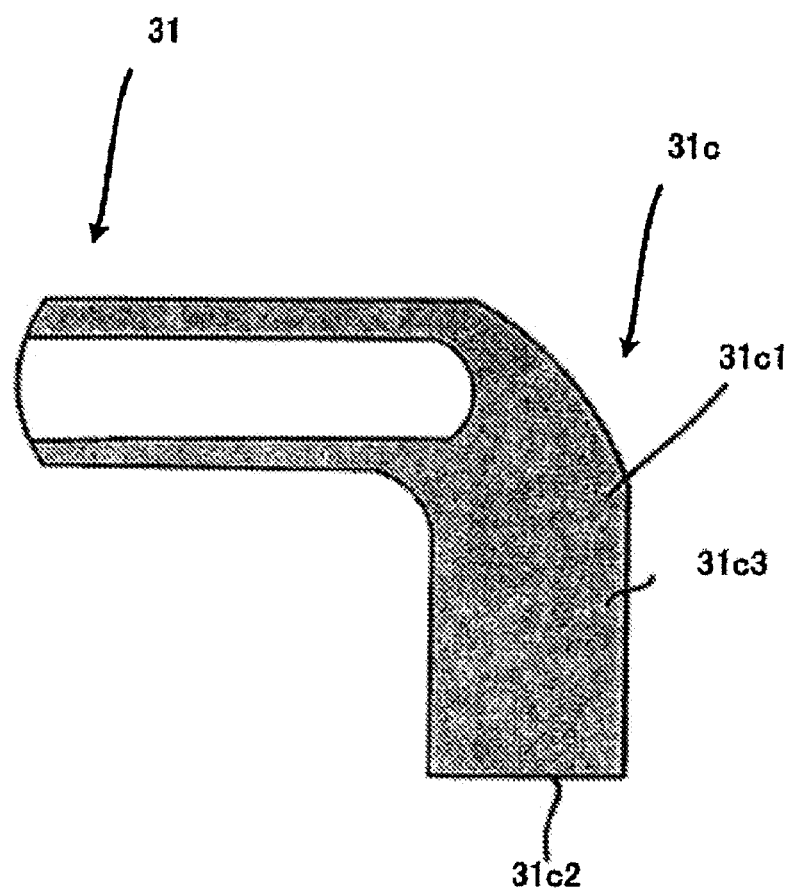
FIG. 6 is an exemplary sectional view showing a structure of the extension of the first heat pipe according to the first embodiment of the invention.
Figure 7:
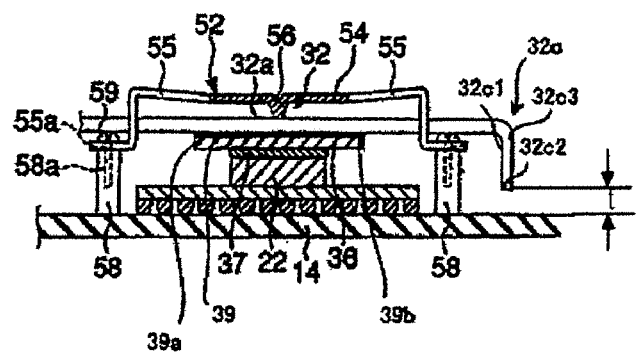
FIG. 7 shows an extension of a second heat pipe and nearby members according to the first embodiment of the invention.
Figure 8:
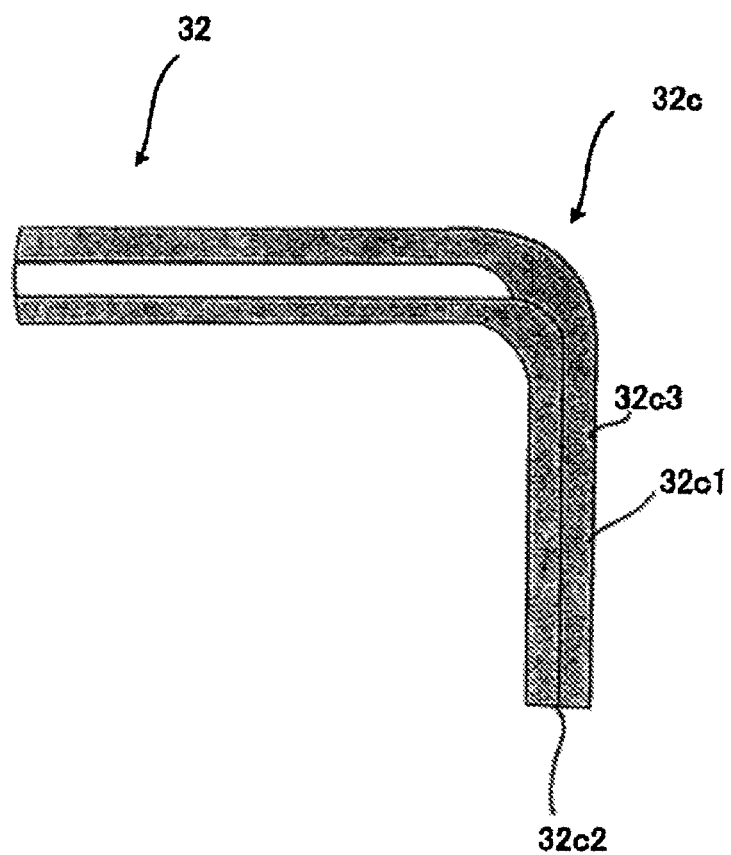
FIG. 8 is an exemplary sectional view showing a structure of the extension of the second heat pipe according to the first embodiment of the invention.

Next, the structures of the extensions 31c1 and 32c1 of the respective heat pipes 31 and 32 according to the embodiment with reference to FIGS. 5 to 8. FIG. 5 shows the extension 31c1 of the first heat pipe 31 and nearby members. FIG. 6 is a sectional view showing the structure of the extension 31c1 of the first heat pipe 31. FIG. 7 shows the extension 32c1 of the second heat pipe 32 and nearby members. FIG. 8 is a sectional view showing the structure of the extension 32c1 of the second heat pipe 32.

As shown in FIG. 5, the extension 31c1 of the first heat pipe 31 according to the embodiment is formed by bending the first end portion 31c of the first heat pipe 31 toward the component mounting surface 14a of the circuit board 14. The extension 31c1 has a counter portion 31c2 which is opposed to the component mounting surface 14a with a gap s formed in between.

As shown in FIG. 6, the extension 31c1 of the first heat pipe 31 according to the embodiment has a hardened portion 31c3 which is increased in rigidity by filling in the internal cavity. The only requirement for the hardened portion 31c3 is that a tip portion of the first heat pipe 31 is increased in rigidity. Therefore, for example, the hardened portion 31c3 may be formed by increasing the thickness of a tip portion of the first heat pipe 31 or forming ribs in the internal cavity of the first heat pipe 31.

On the other hand, as shown in FIG. 7, the extension 32c1 of the second heat pipe 32 according to the embodiment is formed by bending the second end portion 32c of the second heat pipe 32 toward the component mounting surface 14a of the circuit board 14. The extension 32c1 has a counter portion 32c2 which is opposed to the component mounting surface 14a with a gap t formed in between.

As shown in FIG. 8, a tip portion of the extension 32c1 of the second heat pipe 32 according to the embodiment has a hardened portion 32c3 which is increased in rigidity. The hardened portion 32c3 is formed in the following manner. A caulked portion 32c11 in which the internal cavity is eliminated is formed by caulking the second heat pipe 32 in the width n direction. Then, the hardened portion 32c3 is formed by folding the caulked portion 32c11 in the width n direction.

Figure 9A:
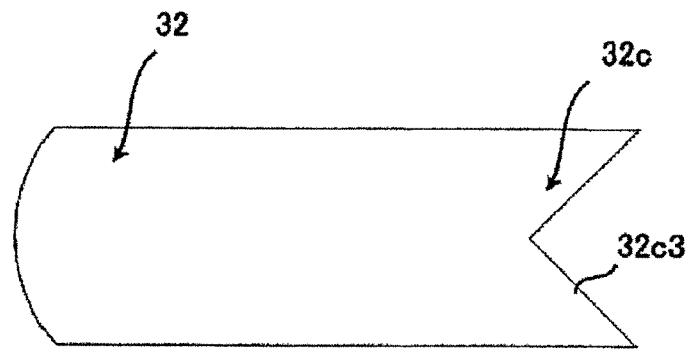
FIGS. 9A and 9B show a first modification of the extension of the second heat pipe according to the first embodiment of the invention.
Figure 9B:
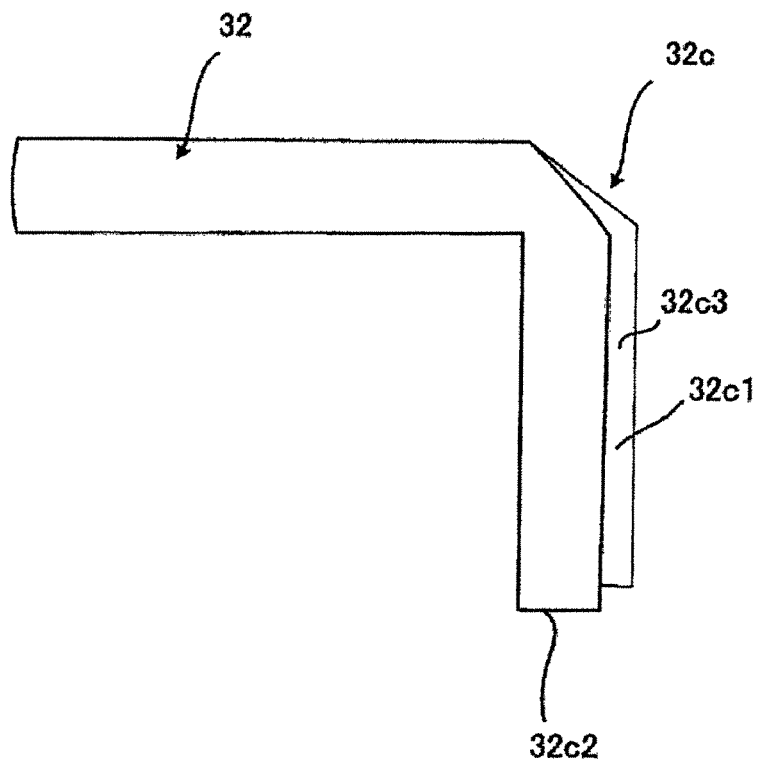
Figure 10A:
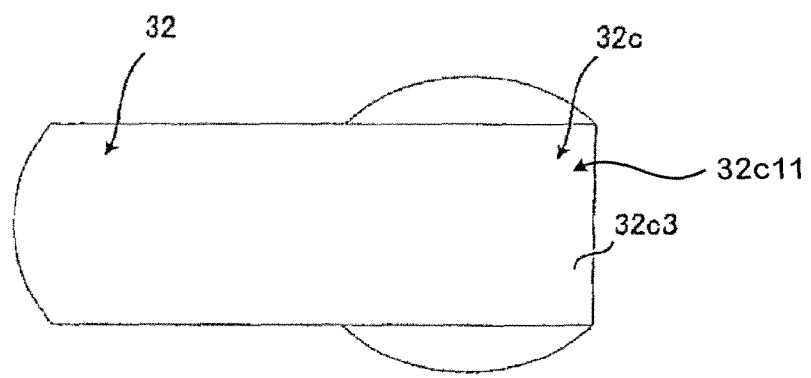
FIGS. 10A and 10B show a second modification of the extension of the second heat pipe according to the first embodiment of the invention.
Figure 10B:
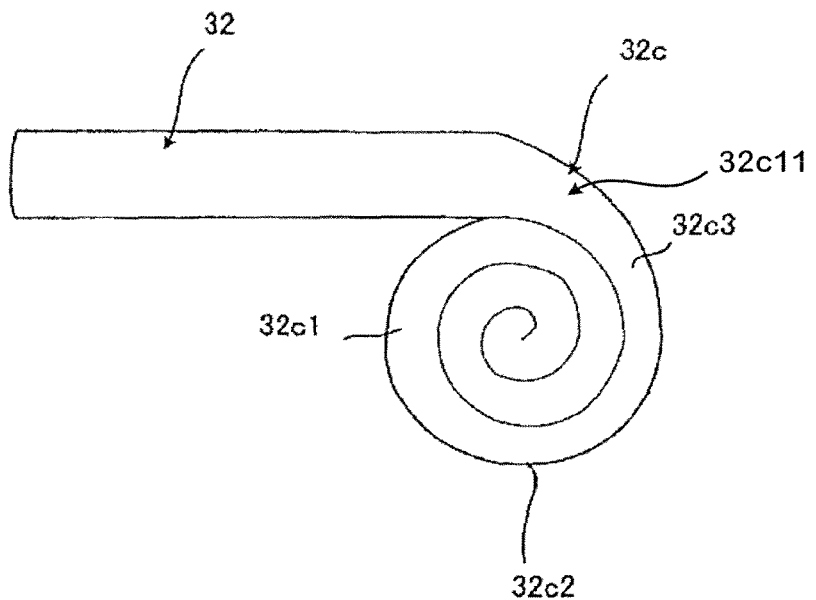
Figure 11A:
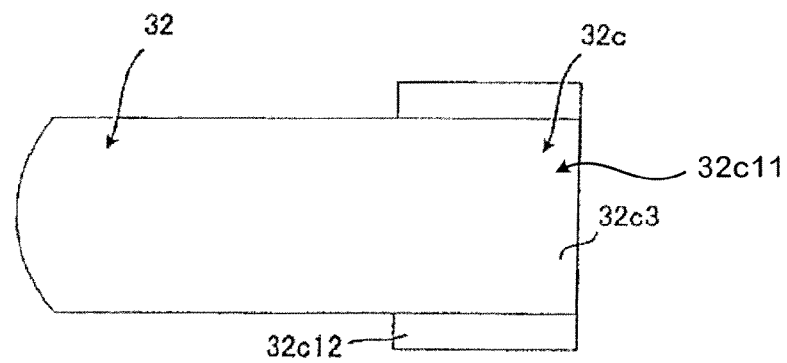
FIGS. 11A and 11B show a third modification of the extension of the second heat pipe according to the first embodiment of the invention.
Figure 11B:
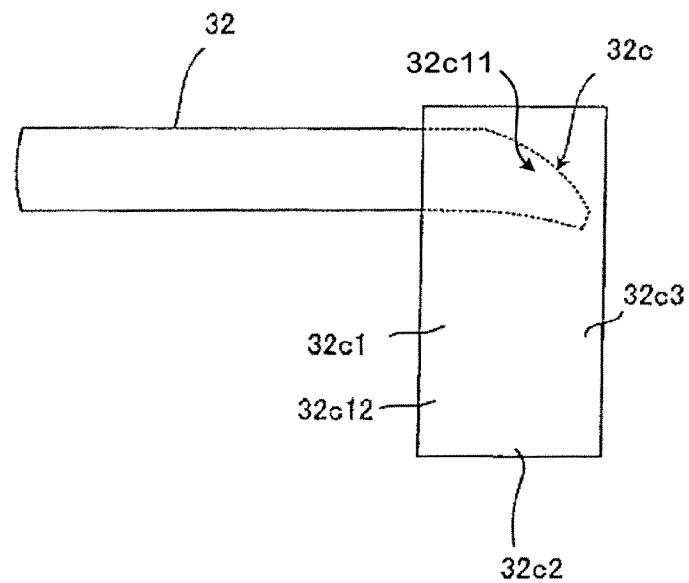
Figure 12A:
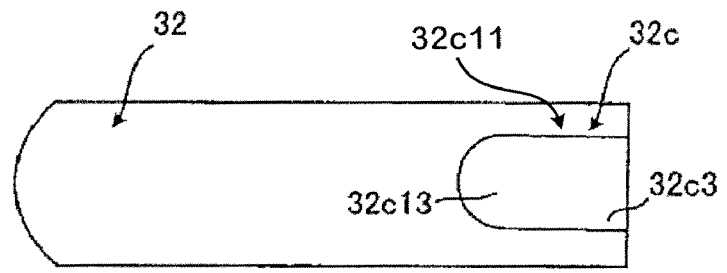
FIGS. 12A to 12C show a fourth modification of the extension of the second heat pipe according to the first embodiment of the invention.
Figure 12B:
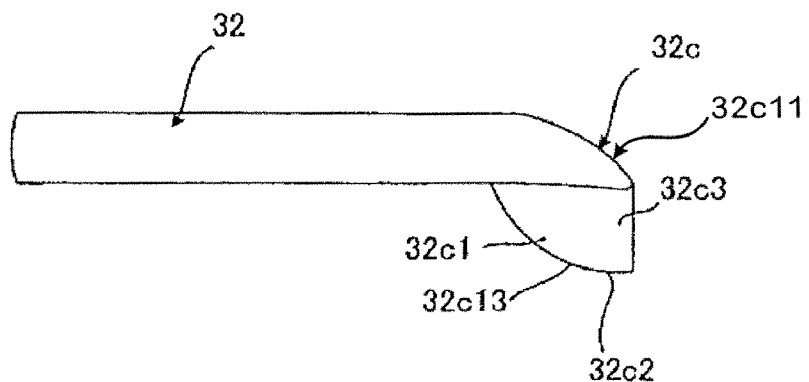
Figure 12C:
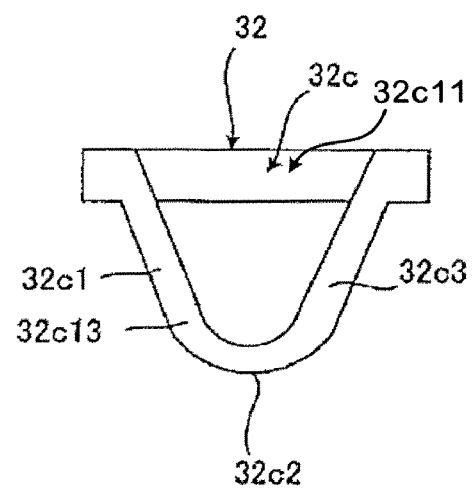

The only requirement for the hardened portion 32c3 is that the tip portion of the second heat pipe 32 is increased in rigidity. Where the width n is smaller than the width m, modifications shown in FIGS. 9A and 9B to FIGS. 12A to 12C, for example, are possible. FIGS. 9A and 9B show the extension 32c1 of the second heat pipe 32 according to a first modification. FIGS. 10A and 10B show the extension 32c1 of the second heat pipe 32 according to a second modification. FIGS. 11A and 11B show the extension 32c1 of the second heat pipe 32 according to a third modification. FIGS. 12A to 12C show the extension 32c1 of the second heat pipe 32 according to a fourth modification.

FIGS. 9A and 9B show an example structure in which the caulked portion 32c11 is bent in the width m direction. FIGS. 9A and 9B are a top view and a perspective view, respectively, of the extension 32c1 of the second heat pipe 32. This structure can make the extension 32c1 stronger than the structure shown in FIGS. 7 and 8.

FIGS. 10A and 10B show an example structure in which the caulked portion 32c11 is wound around the tip. FIGS. 10A and 10B are a top view and a sectional view, respectively, of the extension 32c1 of the second heat pipe 32. Like the structure of FIGS. 9A and 9B, this structure can make the extension 32c1 stronger than the structure shown in FIGS. 7 and 8.

FIGS. 11A and 11B show an example structure in which a separate reinforcement member 32c12 is attached to the caulked portion 32c11. FIGS. 11A and 11B are a top view and a sectional view, respectively, of the extension 32c1 of the second heat pipe 32. Like the structure of FIGS. 9A and 9B, this structure can make the extension 32c1 stronger than the structure shown in FIGS. 7 and 8.

FIGS. 12A to 12C show an example structure in which the caulked portion 32c11 is dented. The caulked portion 32c11 of this modification has a dent 32c13. FIGS. 12A and 12B are a top view and a sectional view, respectively, of the extension 32c1 of the second heat pipe 32. FIG. 12C is a view of the extension 32c1 of the second heat pipe 32 as viewed from the side opposite to the radiation unit 15. Like the structure of FIGS. 9A and 9S, this structure can make the extension 32c1 stronger than the structure shown in FIGS. 7 and 8.

The heat pipes 31 and 32 according to the embodiment are bonded to the heating bodies 21 and 22 via the heat-conductive bonding members 38 and 39, respectively. For example, if stress is applied only from the side of the first end portions 31b and 31d to remove the heat pipes 31 and 32, the heat pipes 31 and 32 may bend at the bonding regions 38a and 39a of the heat-conductive bonding members 38 and 39 because the loads are concentrated at the bonding regions 38a and 39a. In that event, the operating fluid passages in the heat pipes 31 and from the heat receiving portions 31a and 32a to the radiation members 16 and 17 may be deformed or projections and recesses may be formed in the passages. As a result, the heat transport abilities of the heat pipes 31 and 32 are lowered or the heat pipes 31 and 32 are rendered incapable of reuse.

Figure 13:
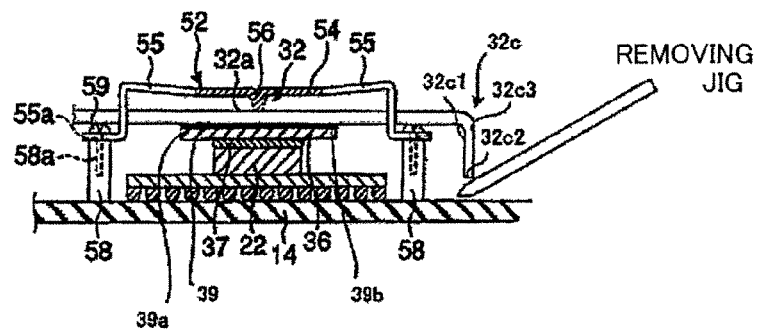
FIG. 13 shows an exemplary heat pipe removing method according to the first embodiment of the invention.

In view of the above, in a method for removing the heat pipes 31 and 32 according to the embodiment, the probability of bending of the heat pipes 31 and 32 is reduced by dispersing the load that is imposed on the region where each of the heat-conductive bonding members 38 and 39 is provided. A method for removing the heat pipes 31 and 32 according to the embodiment will be described below with reference to FIG. 13. FIG. 13 shows a method for removing the second heat pipe according to the first embodiment of the invention. Although only the method for removing the second heat pipe 32 will be described below to simplify the description, the first heat pipe 31 is removed in the same manner.

As described above, the second heat pipe 32 according to the embodiment has the second end portion 32c which is located on the opposite side of the heat receiving portion 32a (which is opposed to the heating body 22) to the first end portion 32b. In the embodiment, with this structure, the second heat pipe 32 can be removed while approximately the same loads are imposed on the regions on both sides of the heat receiving portion 32a, that is, the bonding regions 39a and 39b of the heat-conductive bonding member 39. With this measure, the probability that the second heat pipe 32 is bent at the bonding regions 39a or 39b or its vicinity can be halved or made even lower.

The second end portion 32c is provided with the extension 32c1, and the extension 32c1 is provided with the counter portion 32c2.

As a result, in the embodiment, as shown in FIG. 13, the second heat pipe 32 can easily be lifted up on the side of the second end portion 32c by inserting a removing jig between the counter portion 32c2 and the component mounting surface 14a of the circuit board 14.

The tip portion of the first heat pipe 32 is provided with the hardened portion 32c3 which is increased in rigidity. This prevents the extension 32c1 from being broken when stress for lifting up the second heat pipe 32 in the direction perpendicular to the component mounting surface 14a of the circuit board 14 is applied.

Figure 14:
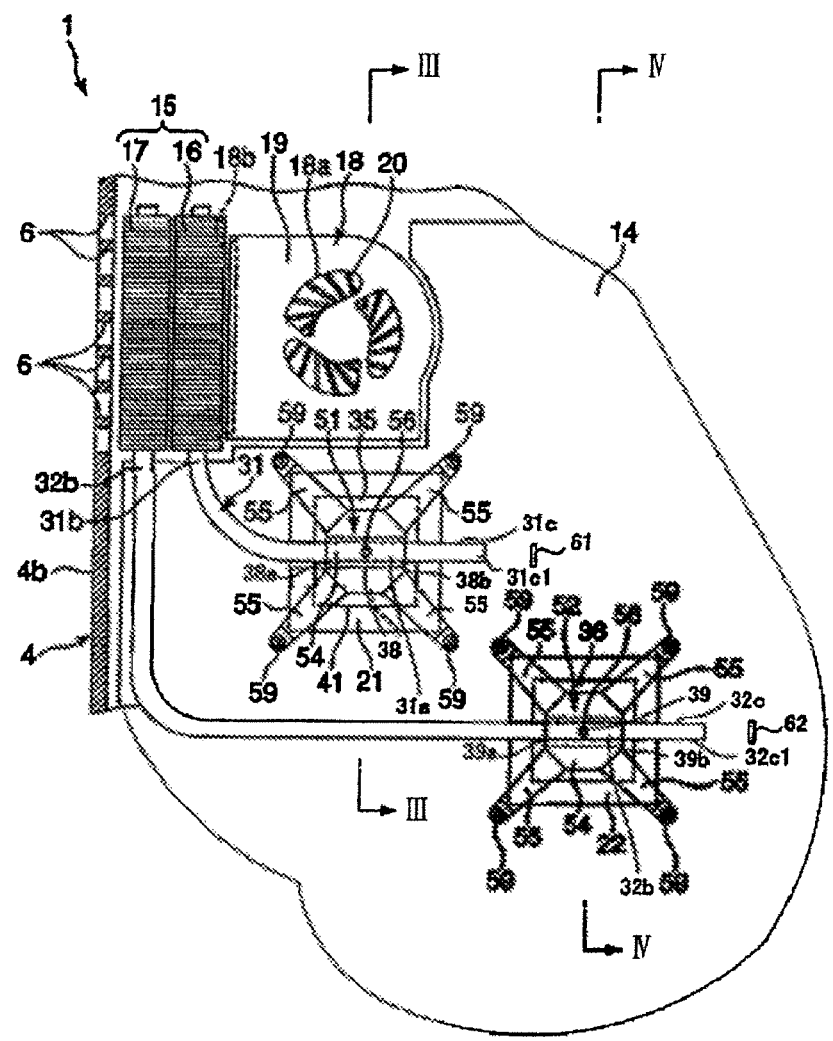
FIG. 14 shows the configuration of a portable computer according to a second embodiment of the invention.
Figure 15:
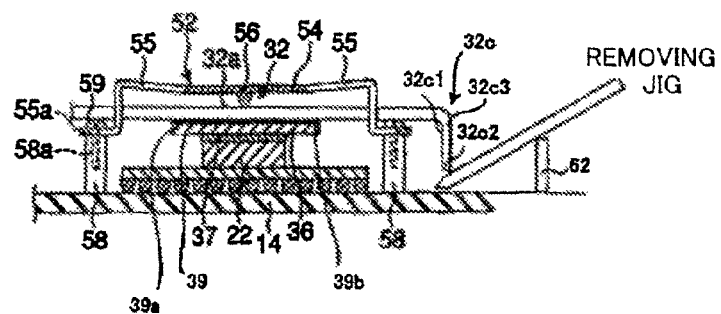
FIG. 15 shows a heat pipe removing method according to the second embodiment of the invention.

Next, a portable computer 1 as an electronic apparatus according to a second embodiment of the invention will be described with reference to FIGS. 14 and 15. Members etc. having the same or similar functions etc. in the first embodiment will be given the same reference symbols and their descriptions will be omitted. FIG. 14 shows the configuration of the portable computer 1 according to the second embodiment of the invention. FIG. 15 shows a method for removing the second heat pipe 32 according to the second embodiment of the invention.

As shown in FIG. 14, in the portable computer 1 according to the embodiment, ribs 61 and 62 are formed on the circuit board 14 in the vicinities of the second end portions 31c and 32c of the heat pipes 31 and 32, respectively.

With this configuration, as shown in FIG. 15, the second heat pipe 32 can easily be lifted up by leverage on the side of the second end portion 32c by inserting a removing jig between the counter portion 32c2 of the second heat pipe 32 and the component mounting surface 14a of the circuit board 14 and placing the removing jig on the rib 62. The first heat pipe 31 is removed in the same manner.

Although the portable computer 1 according to the first and second embodiments of the invention has been described above, the invention is not limited to them.

The invention is not limited to the above embodiments themselves and, in the practice stage, may be embodied in such a manner that constituent elements are modified without departing from the spirit and scope of the invention. And various inventions can be conceived by properly combining plural constituent elements disclosed in each embodiment. For example, several ones of the constituent elements of each embodiment may be omitted. Furthermore, constituent elements of the two embodiments may be combined as appropriate.

What is claimed is:

1. An electronic apparatus comprising:
    a body;
    a circuit board housed in the body;
    a heating body mounted on the circuit board;
    a heat pipe having: an end portion including an extension that extends toward the circuit board, a heat emitting portion located on an opposite side to the end portion, and a heat receiving portion located between the end portion and the heat emitting portion and thermally connected to the heating body; and
    a bonding member disposed between the heating body and the heat receiving portion and that bonds the heating body and the heat receiving portion.

2. The electronic apparatus according to claim 1, wherein the heat pipe has a flat shape in which a width in a direction along the circuit board is greater than a width in a direction perpendicular to the circuit board.

3. The electronic apparatus according to claim 2, wherein the extension has a counter portion that is opposed to and separated from the circuit board.

4. The electronic apparatus according to claim 3, wherein the extension is formed by bending a part of the end portion of the heat pipe toward the circuit board.

5. The electronic apparatus according to claim 4, wherein the end portion of the heat pipe has a caulked portion formed by being caulked in the direction along the circuit board.

6. The electronic apparatus according to claim 5, wherein the counter portion of the extension has a hardened portion that is increased in rigidity by bending a part of the caulked portion.

7. The electronic apparatus according to claim 6, wherein the hardened portion is increased in rigidity by bending the caulked portion in a width direction.

8. The electronic apparatus according to claim 7, wherein the hardened portion has a projection that projects from a part of a tip.

9. The electronic apparatus according to claim 6, wherein the hardened portion is increased in rigidity by winding the caulked portion around a tip of the heat pipe.

10. The electronic apparatus according to claim 3, wherein the circuit board has a rib disposed in a vicinity of the counter portion.

* * * * *